(12) United States Patent
Wu et al.

(10) Patent No.: US 9,093,263 B2
(45) Date of Patent: Jul. 28, 2015

(54) UNDERLAYER COMPOSITION FOR PROMOTING SELF ASSEMBLY AND METHOD OF MAKING AND USING

(71) Applicants: Hengpeng Wu, Hillsborough, NJ (US); Jian Yin, Bridgewater, NJ (US); Guanyang Lin, Whitehouse Station, NJ (US); JiHoon Kim, North Wales, PA (US); Jianhui Shan, Pennington, NJ (US)

(72) Inventors: Hengpeng Wu, Hillsborough, NJ (US); Jian Yin, Bridgewater, NJ (US); Guanyang Lin, Whitehouse Station, NJ (US); JiHoon Kim, North Wales, PA (US); Jianhui Shan, Pennington, NJ (US)

(73) Assignee: AZ ELECTRONIC MATERIALS (LUXEMBOURG) S.A.R.L., Luxembourg (LU)

( * ) Notice: Subject to any disclaimer, the term of this patent is extended or adjusted under 35 U.S.C. 154(b) by 0 days.

(21) Appl. No.: 14/039,809

(22) Filed: Sep. 27, 2013

(65) Prior Publication Data
US 2015/0093912 A1    Apr. 2, 2015

(51) Int. Cl.
*H01L 21/02* (2006.01)
*C03C 15/00* (2006.01)

(52) U.S. Cl.
CPC .... *H01L 21/02118* (2013.01); *H01L 21/02282* (2013.01)

(58) Field of Classification Search
CPC ................................ H01L 21/02; C03C 15/00
USPC ............ 524/556; 216/41, 42, 49, 66; 427/532
See application file for complete search history.

(56) References Cited

U.S. PATENT DOCUMENTS

| | | | |
|---|---|---|---|
| 3,161,630 A | 12/1964 | Phelisse et al. | |
| 3,285,949 A | 11/1966 | Siebert | |
| 3,474,054 A | 10/1969 | White | |
| 3,919,077 A | 11/1975 | Whitehurst | |
| 4,200,729 A | 4/1980 | Calbo | |
| 4,251,665 A | 2/1981 | Calbo | |
| 4,698,394 A | 10/1987 | Wong | |
| 5,136,029 A | 8/1992 | Furukawa et al. | |
| 5,187,019 A | 2/1993 | Calbo et al. | |
| 5,446,125 A | 8/1995 | Honda et al. | |
| 5,674,662 A | 10/1997 | Szmanda et al. | |
| 5,929,204 A | 7/1999 | Noguchi et al. | |
| 6,512,020 B1 | 1/2003 | Asakura et al. | |
| 7,471,614 B2 | 12/2008 | Frommer et al. | |
| 7,521,094 B1 | 4/2009 | Cheng et al. | |
| 7,560,141 B1 | 7/2009 | Kim et al. | |
| 7,846,502 B2 | 12/2010 | Kim et al. | |
| 8,017,194 B2 | 9/2011 | Colburn et al. | |
| 8,226,838 B2 * | 7/2012 | Cheng et al. | 216/41 |
| 8,309,278 B2 | 11/2012 | Yang et al. | |
| 8,491,965 B2 | 7/2013 | Cheng et al. | |
| 8,686,109 B2 | 4/2014 | Yin et al. | |
| 8,691,925 B2 | 4/2014 | Wu et al. | |
| 8,795,539 B2 | 8/2014 | Lee et al. | |
| 8,835,581 B2 | 9/2014 | Wu et al. | |
| 2004/0151690 A1 | 8/2004 | Nakanishi et al. | |
| 2004/0157948 A1 | 8/2004 | Schlueter | |
| 2005/0062801 A1 | 3/2005 | Kato et al. | |
| 2007/0276104 A1 | 11/2007 | Harruna et al. | |
| 2008/0299353 A1 | 12/2008 | Stoykovich et al. | |
| 2008/0318005 A1 | 12/2008 | Millward | |
| 2009/0035668 A1 | 2/2009 | Breyta et al. | |
| 2009/0075002 A1 | 3/2009 | Kim et al. | |
| 2009/0087653 A1 | 4/2009 | Nealey et al. | |
| 2009/0179002 A1 | 7/2009 | Cheng et al. | |

(Continued)

FOREIGN PATENT DOCUMENTS

CA    1 293 090 C    12/1991
EP    0 227 124 A2    7/1987

(Continued)

OTHER PUBLICATIONS

Nathan D. Jarnagin et al. "PS-b-PHOST as a high X block copolymers for directed self assembly: optimization of underlayer and solvent anneal processes", SPIE 8680, Alternative Lithographic Technologies V, 86801X (Apr. 5, 2013).*

(Continued)

*Primary Examiner* — Michael M Bernshteyn
(74) *Attorney, Agent, or Firm* — Sangya Jain

(57) ABSTRACT

Disclosed herein is a formulation for depositing a cured underlayer for promoting the formation of self assembled structures. The underlayer comprises: (a) a polymer comprising at least one pendant vinyl ether monomer repeat unit having the structure, (I):

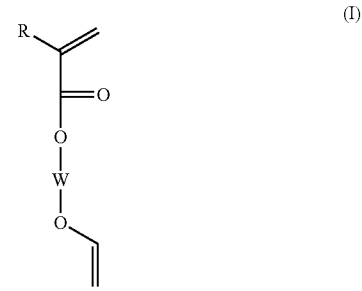

wherein R is chosen from H, $C_1$-$C_4$ alkyl, or halogen, and W is a divalent group chosen from $C_1$-$C_6$ alkylene, $C_6$-$C_{20}$ arylene, benzylene, or $C_2$-$C_{20}$ alkyleneoxyalkylene; (ii) optional thermal acid generator; and (c) a solvent. The invention also relates to processes of forming a pattern using the underlayer.

20 Claims, 1 Drawing Sheet

(56) References Cited

U.S. PATENT DOCUMENTS

| | | |
|---|---|---|
| 2009/0196488 A1 | 8/2009 | Nealey et al. |
| 2010/0124629 A1 | 5/2010 | Gopalan et al. |
| 2010/0316849 A1 | 12/2010 | Millward et al. |
| 2011/0147984 A1 | 6/2011 | Cheng et al. |
| 2012/0273460 A1 | 11/2012 | Kang et al. |
| 2012/0285929 A1 | 11/2012 | Matsumura et al. |
| 2013/0012618 A1 | 1/2013 | Hiro et al. |
| 2013/0280497 A1 | 10/2013 | Wilson et al. |
| 2013/0330668 A1 | 12/2013 | Wu et al. |
| 2014/0151330 A1 | 6/2014 | Yin et al. |
| 2014/0193754 A1 | 7/2014 | Wu et al. |
| 2014/0335324 A1 | 11/2014 | Kim et al. |

FOREIGN PATENT DOCUMENTS

| | | |
|---|---|---|
| EP | 1 095 711 A2 | 5/2001 |
| GB | 715913 | 9/1954 |
| JP | 58-225103 A | 12/1983 |
| JP | 2003-48929 A | 2/2003 |
| JP | 2003-238682 A | 8/2003 |
| JP | 2008-88368 A | 4/2008 |
| JP | 2010-260883 A | 11/2010 |
| JP | 2011-18778 A | 1/2011 |
| WO | WO 2008/097736 A2 | 8/2008 |
| WO | WO 2012/022390 A1 | 2/2012 |
| WO | WO 2012/161106 A1 | 11/2012 |
| WO | WO 2013/050338 A1 | 4/2013 |
| WO | WO 2013/156240 A1 | 10/2013 |
| WO | WO 2013/160027 A1 | 10/2013 |

OTHER PUBLICATIONS

Restriction Requirement notification date Dec. 31, 2014 for U.S. Appl. No. 13/892,890.
Machine Language English Abstract from JPO of JP 58-225103 A.
Machine Language English Abstract and Translation from JPO of JP 2013-8951 A, which is equivalent to WO 2012/161106 A1.
Form PCT/ISA/220) Form PCT/ISA/210, and Form PCT/ISA/237 dated Feb. 26, 2013 for PCT/IB2012/001905, which corresponds to U.S. Appl. No. 13/164,869.
Form PCT/ISA/220) Form PCT/ISA/210, and Form PCT/ISA/237 dated Jul. 11, 2013 for PCT/EP2013/053548, which corresponds to U.S. Appl. No. 13/416,669.
Form PCT/ISA/220) Form PCT/ISA/210, and Form PCT/ISA/237 dated Aug. 28, 2013 for PCT/EP2013/001423, which corresponds to U.S. Appl. No. 13/492,125.
Koji Asakawa et al., "Nanopatterning with Microdomains of Block Copolymers using Reactive-Ion Etching Selectivity", Jpn. J. Appl. Phys. vol. 41 Part 1 No. 10, pp. 6112-6118 (2002).
Joona Bang et al., "Facile Routes to Patterned Surface Neutralization Layers for Block Copolymer Lithography", Advanced Materials vol. 19, pp. 4552-4557 (2007).
Christopher N. Bates et al., "Single- and Dual-Component Cross-Linked Polymeric Surface Treatments for Controlling Block Copolymer Orientation", Polymer Preprints vol. 52(1), pp. 181-182 (2011).
C. T. Black et al., "Integration of self-assembled diblock copolymers for semiconductor capacitor fabrication," Applied Physics Letters vol. 79 No. 3, pp. 409-411 (2001).
Kenneth C. Caster, "Applications of Polymer Brushes and Other Surface-Attached Polymers", Polymer Brushes Part 17, pp. 331-370 (2004).
Ghislain David et al., "Synthesis of α,ω-Phosponate Polysterene Via Dead End Polymerization, Phosporus, Sulfur, and Silicon", Phosphorus, Sulfur, and Silicon vol. 179 No. 12, pp. 2627-2634 (2004).
Eric Drockenmuller et al., "Covalent Stabilization of Nanostructures: Robust Block Copolymer Templates from Novel Thermoreactive Systems," Journal of Polymer Science: Part A: Polymer Chemistry, vol. 43, pp. 1028-1037 (2005).
Iain E. Dunlop, "Interactions Between Polymer Brushes: Varying the Number of End Attaching Groups", Macromol. Chem. Phys. vol. 205, pp. 2443-2450 (2004).
Eungnak Han et al., "Photopatternable Imaging Layers for Controlling Block Copolymer Microdomain Orientation", Advanced Materials vol. 19, pp. 4448-4452 (2007).
Craig J. Hawker et al., "Facile Synthesis of Block Copolymers for Nanolithographic Applications", Polymer Preprints vol. 46(2), pp. 239-240 (2005).
Craig J. Hawker, Initiating Systems for Nitroxide-Mediated "Living" Free Radical Polymerizations: Synthesis and Evaluation, Macromolecules vol. 29 No. 16, pp. 5245-5254 (1996).
Atsushi Hieno et al., "Quick Formation of DSA Neutralization Polymer Layer Attached by Reactive Self-Assembled Monolayer," J. Photopol. Sci. Tech. vol. 25 No. 1, pp. 73-76 (2012).
E. Huang et al., "Using Surface Active Random Copolymers to Control the Domain Orientation in Diblock Copolymer Thin Films", Macromolecules vol. 31 No. 22, pp. 7641-7650 (1998).
Shengxiang Ji et al., "Preparation of Neutral Wetting Brushes for Block Copolymer Films from Homopolymer Blends", Advanced Materials vol. 20, pp. 3054-3060 (2008).
G. J. Kellogg et al., "Observed Surface Energy Effects in Confined Diblock Copolymers", Physical Review Letters vol. 76 No. 14, pp. 2503-2506 (1996).
Bokyung Kim et al., "Dewetting of PMMA on PS-Brush Substrates", Macromolecules vol. 42 No. 20, pp. 7919-7923 (2009).
Bong Hoon Kim et al.; The Synthesis of Random Brush for Nanostructure of Block Copolymer, Macromol. Symp., vol. 249-250, pp. 303-306 (2007).
Bumjoon J. Kim et al., "Importance of End-Group Structure in Controlling the Interfacial Activity of Polymer-Coated Nanoparticles", Macromolecules vol. 40 No. 6, pp. 1796-1798 (2007).
Yoojin Kim et al., "Effect of Architecture on the Self-Assembly of Block Copolymers at Interfaces: Linear-nanoparticle vs. Linear AB Diblocks", Polymeric Materials: Science & Engineering Vo. 92, pp. 399-400 (2005).
Yoojin Kim et al., "The Dramatic Effect of Architecture on the Self-Assembly of Block Copolymers at Interfaces", Langmuir vol. 21 No. 23, pp. 10444-10458 (2005).
Massimo Lazzari et al., "Methods for the Alignment and the Large-scale Ordering of Block Copolymer Morphologies," Block Copolymers in Nanoscience, Edited by M. Lazzari, G. Liu, and S. Lecommandoux, Copyright © 2006 Wiley-VCH Verlag GmbH & Co. KGaA, Weinheim, pp. 191-231.
Julie M. Leiston-Belanger et al., "A Thermal and Manufacture Approach to Stabilized Diblock Copolymer Templates", Macromolecules vol. 38 No. 18, pp. 7676-7683 (2005).
Mao-Peng Lin et al., "Photocrosslinking of Polymers Containing Cationically Polymerizable Groups in the Side-Chain by Sulfonium Salts," Journal of Polymer Science Part A: Polymer Chemistry vol. 30 Issue 5, pp. 933-936, (1992).
Nancy A. Listigovers et al., "Narrow Polydispersity Diblock and Triblock Copolymers of Alkyl Acrylates by a "Living" Stable Free Radical Polymerization", Macromolecules vol. 29 No. 27, pp. 8992-8993 (1996).
Hui Liu et al., "Random Poly(methyl methacrylate-co-styrene) Brushes by ATRP to Create Neutral Surfaces for Block Copolymer Self-Assembly," Macromol: Chem. Phys. vol. 213, pp. 108-115 (2012).
P. Mansky et al., "Controlling Polymer-Surface Interactions with Random Copolymer Brushes", Science Magazine vol. 275, pp. 1458-1460 (1997).
Holger Merlitz, "Surface Instabilities of Monodisperse and Densely Grafter Polymer Brushes", Macromolecules vol. 41 No. 13, pp. 5070-5072 (2008).
Hironobu Murata et al., "Synthesis of Functionalized Polymer Monolayers from Active Ester Brushes", Macromolecules vol. 40 No. 15, pp. 5497-5503 (2007).
Timothy E. Patten et al., "Atom Transfer Radical Polymerization and the Synthesis of Polymeric Materials", Adv. Mater. vol. 10 Issue 12, pp. 901-915 (1998).
R. P. Quirk et al., "Thermoplastic Elastomers 2nd Edition", Hanser/Gardner Publications, pp. 74-78 (1996).
Ricardo Ruiz et al., "Density Multiplication and Improved Lithography by Directed Block Copolymer Assembly", Science Magazine vol. 321, pp. 936-939 (2008).

(56) References Cited

OTHER PUBLICATIONS

Du Yeol Ryu et al., "Cylindrical Microdomain Orientation of PS-b-PMMA on the Balanced Interfacial Interactions: Composition Effect of Block Copolymers," Macromolecules vol. 42 No. 13, pp. 4902-4906 (2009).

Du Yeol Ryu et al., "A Generalized Approach to the Modification of Solid Surfaces", Science Magazine vol. 308, pp. 236-239 (2005).

I. E. Serhatli, "Synthesis of hybrid liquid crystalline block copolymers by combination of cationic or promoted cationic and free-radical polymerizations", Polymer Bulletin vol. 34, pp. 539-546 (1995).

Kazuo Sugiyama et al., "Preparation of surface-modified polysterene microspheres by an azo-initiator having analogous structure to the head group of phosphatidylcholine", Macromol. Chem. Phys. vol. 195, pp. 1341-1352 (1994).

Form PCT/ISA/220, Form PCT/ISA/210, and Form PCT/ISA/237 dated Aug. 6, 2014 for PCT/EP2014/059568, which corresponds to U.S. Appl. No. 13/892,890.

Joy Y. Cheng et al., "Templated Self-Assembly of Block Copolymers: Effect of Substrate Topography", Adv. Mater. vol. 15 No. 19, pp. 1599-1602 (2003).

Form PCT/ISA/220, Form PCT/ISA/210, and Form PCT/ISA/237 dated Feb. 10, 2015 for PCT/EP2014/076849, which corresponds to U.S. Appl. No. 14/039,890.

Nathan D. Jarnagin et al., PS-b-PHOST as a High $_\chi$ Block Copolymers for Directed Self Assembly: Optimnization of Underlayer and Solvent Anneal Processes, SPIE vol. 8680, pp. 86801X-1-86801X-10 (2013).

Form PCT/ISA/220, Form PCT/ISA/210, and Form PCT/ISA/237 dated Feb. 26, 2013 for PCT/IB2012/001905, which corresponds to U.S. Appl. No. 13/243,640.

Form PCT/IB/326, Form PCT/IB/373, and Form PCT/ISA/237 dated Apr. 3, 2014 for PCT/IB2012/001905, which corresponds to U.S. Appl. No. 13/243,640.

Notice of Allowance and Fee(s) Due date mailed May 19, 2014 for U.S. Appl. No. 13/492,125.

T. Thurn-Albrecht et al., "Ultrahigh-Density Nanowire Arrays Grown in Self-Assembled. Diblock Copolymer Templates", Science Vo. 290, pp. 2126-2129 (2000).

Toru Yamaguchi et al., "Resist-Pattern Guided Self-Assembly of Symmetric Diblock Copolymer", Journal of Photopolymer Science and Technology vol. 19 No. 3, pp. 385-388 (2006).

Toru Yamaguchi et al., "Two-Dimentional Patterning of Flexible Designs with High Half-Pitch Resolution by Using Block Copolymer Lithography", Advanced Materials vol. 20, pp. 1684-1689 (2008).

Yuanlie Yu et al., "The synthesis of novel fluorine-containing random polymer and application in modification of solid surfaces", Surface & Coatings Technology vol. 205, pp. 205-212 (2010.

Notice of Allowance and Fee(s) Due date mailed Apr. 21, 2014 for U.S. Appl. No. 13/492,125.

Notice of Allowance and Fee(s) Due notification date Feb. 20, 2015 for U.S. Appl. No. 14/180,848.

Notice of Allowance and Fee(s) Due notification date Jan. 22, 2015 for U.S. Appl. No. 14/175,203.

Form PCT/ISA/220, Form PCT/ISA/210, and Form PCT/ISA/237 dated Jan. 14, 2015 for PCT/EP2014/070391, which corresponds to U.S. Appl. No. 14/039,890.

Office Action notification date Oct. 10, 2014 for U.S. Appl. No. 14/175,203.

Office Action notification date Apr. 2, 2015 for U.S. Appl. No. 13/892,890.

Office Action notification date Apr. 16, 2015 for U.S. Appl. No. 14/107,325.

* cited by examiner

UNDERLAYER COMPOSITION FOR PROMOTING SELF ASSEMBLY AND METHOD OF MAKING AND USING

FIELD OF THE INVENTION

The present application for patent is in the field of lithographic patterning by directed self assembly and more specifically in the area of energy neutral and pinning underlayers that support the formation of self assembled features.

BACKGROUND

In recent years, directed self assembly has emerged as a useful means of organizing solution-synthesized nanostructures to create lithographic features and for a wide variety of other applications. For example see Thurn-Albrecht et al., "Ultrahigh Nanowire Arrays Grown in Self-Assembled Diblock Copolymer Templates", Science, 290, 2126, (2000). Black et al., "Integration of Self-Assembled Diblock Copolymers for Semiconductor Capacitor Fabrication," Applied Physics Letters, 79, 409, (2001) and Akasawa et al., "Nanopatterning with Microdomains of Block Copolymers for Semiconductor Capacitor Fabrication," Jpn. J. Appl. Phys., 41, 6112, (2002).

In many directed self assembly applications, molecular interactions drive phase separation into domains; wherein immiscible polar and nonpolar materials are concentrated. Of particular interest in directed self assembly applications are thin films of block copolymers that have polar and nonpolar blocks said blocks having predetermined sizes corresponding to their individual molar masses. These blocks of selected size render domains with a natural length scale associated with their respective molar masses and compositions. Further, by tuning the molar masses of the individual blocks within block copolymers, one can generate various morphologies with selected sizes, such as lamellae or cylinders of a specific width, specific pitch and specific symmetry patterns such as hexagonal close packed arrays or parallel lines.

Film layers made with energy neutral polymers (hereinafter, neutral layers) are sometimes used because they do not show preferred wetting for one of the polymer blocks over another and, therefore, tend not to enforce or guide, preferentially, the formation of a particular domain at a particular location. Neutral layers may be, functionalized polymer brushes, random copolymers having similar repeat units to those used in the block copolymer being used or blends of homopolymers, each respectively having similar monomers to those in the block copolymer being used.

Pinning layers are film layers made with polymers having a predominance of similar monomers to those in one of the blocks. These are sometimes used because they do show a preferred wetting for one of the polymer blocks over another and, therefore, tend to enforce or "pin," preferentially, the formation of a particular domain at a particular location.

Among the methods used to guide self-assembly in thin films of block copolymers are graphoepitaxy and chemical epitaxy. In graphoepitaxy self-assembly is guided by pre formed topographical structures such as trenches. For example, a topographically patterned substrate with a neutral underlying surface and with sidewalls that are preferentially attracted to one type of the block copolymer domain (for example, the A domains of an A-B diblock copolymer assembly) can be used to direct self-assembly inside the trench through topographical confinement. With a trench of width L and a block copolymer (BCP) having a periodicity of $P_{BCP}$, frequency multiplication of a factor of $L/P_{BCP}$ can be achieved for the remaining domain.

Various attempts have been made to incorporate crosslinking functionality into either a pinning layer or a neutral layer; the activation of which crosslinks the underlayer and retards comingling between the underlayer and the block copolymer. For example, in U.S. Pat. No. 8,226,838, Cheng et al. disclose an underlayer comprising "a cross linked organic polymer including an epoxy-based homopolymer or copolymer." wherein epoxy based monomer repeat units include epoxydicyclopentadienyl methacrylate, glycidyl (meth)acrylate, 2,3-epoxycyclohexyl (meth)acrylate, (2,3-epoxycyclohexyl) methyl (meth)acrylate, 5,6-epoxynorbornene (meth)acrylate, and combinations comprising at least one of the foregoing. The epoxy based monomers are copolymerized with various other monomers, including styrene and methyl methacrylate, alone or in combination to provide, respectively, pinning layers or neutral layers as required. However, while the epoxy-based monomer repeat units listed above may work to provide a crosslinked substrate, they are less than effective in matching the interaction properties of monomers such as methyl methacrylate.

Therefore, there remains a need for polymer compositions that provide thermally crosslinkable curing and, at the same time provides surface interaction characteristics that resemble methyl(meth)acrylate.

SUMMARY OF THE INVENTION

The present invention relates to a formulation for depositing an underlayer for promoting the formation of self assembled structures. The underlayer comprises: (a) a polymer comprising at least one pendant vinyl ether monomer repeat unit having the structure, (I):

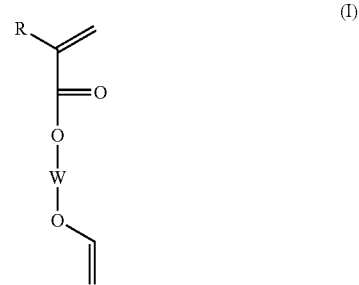

wherein R is chosen from H, $C_1$-$C_4$ alkyl, or halogen, and W is a divalent group chosen from $C_1$-$C_6$ alkylene, $C_6$-$C_{20}$ arylene, benzylene, or $C_2$-$C_{20}$ alkyleneoxyalkylene; (ii) optional thermal acid generator; and (c) a solvent. The invention also relates to processes of forming a pattern using the underlayer.

DETAILED DESCRIPTION

Figure 1:
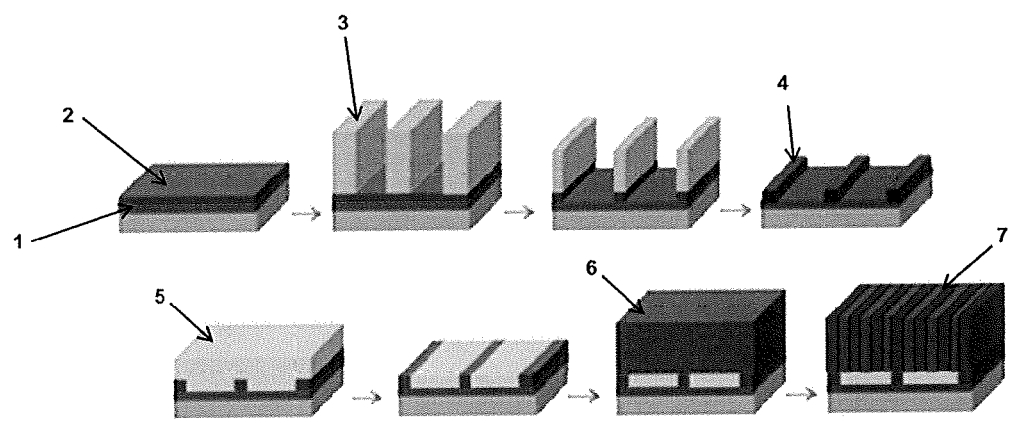
FIG. 1 relates to a process for direct self assembly of a block copolymer.

As used herein, the conjunction "and" is intended to be inclusive and the conjunction "or" is not intended to be exclusive unless otherwise indicated or made clear or necessary by context. For example, the phrase "or, alternatively" is intended to be exclusive. Further, for example, the conjunction "or" is understood to be exclusive when describing chemical substitution on a single site. The articles "a" and "the" as used herein are understood to encompass the plural as well as the singular. As used herein, the term "copolymer" is understood to comprise two or more monomer repeat units and a "polymer" may be a homopolymer, or a copolymer. As used herein, when the prefix, "(meth)acryl" is used, "acryl" or "methacryl" is intended. For example, (meth)acrylate may represent an acrylate or a methacrylate. As used herein, the adjective, "exemplary" is intended to mean illustrative of a characteristic, without expressing preference. Arylene refers to substituted or unsubstituted arylene, where the substituents may be alkyls or alkylenes, and arylene refers to phenylene or other aromatics.

Disclosed herein is a novel formulation for depositing an underlayer for promoting the formation of self assembled structures. The underlayer may be a pinning layer or a neutral layer. The underlayer comprises: (a) a polymer comprising at least one pendant vinyl ether monomer repeat unit having the structure, (I):

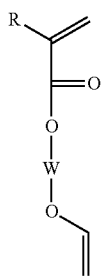

(I)

wherein R is selected from a group consisting of H, $C_1$-$C_4$ alkyl, and halogen, and W is a divalent group selected from a group consisting of $C_1$-$C_6$ alkylene, $C_6$-$C_{20}$ unsubstituted or substituted arylene, and $C_2$-$C_{20}$ alkyleneoxyalkylene; (b) optional thermal acid generator; and (c) a solvent. In one embodiment the thermal acid generator is not a sulfonium or iodonium salt. The novel polymer is a random copolymer. The ratio of structure (I) in the polymer can range from about 5 to about 25, or about 5 to about 20, or about 10 to about 25, or 10 to about 20 by mole % in the polymer as related to the total monomeric units.

Further disclosed herein is a process for producing a novel formulation for depositing an underlayer for promoting the formation of self assembled structures. The process comprises: (a) agitating a mixture, comprising (i) a polymer comprising at least one pendant vinyl ether monomer repeat unit having the structure, (I): wherein R is chosen from H, $C_1$-$C_4$ alkyl, or halogen, and W is a divalent group chosen from $C_1$-$C_6$ alkylene, $C_6$-$C_{20}$ arylene, benzylene, or $C_2$-$C_{20}$ alkyleneoxyalkylene; (ii) optional thermal acid generator; and (iii) a solvent, and whereby a homogenous solution is produced. The thermal acid generator is not a sulfonium or iodonium salt in one embodiment. The process may further comprise filtering the resulting homogeneous solution.

Still further disclosed herein is a process for directing a multiplied pattern in a block copolymer film, said process including the steps of: (a) providing a block copolymer having two or more spontaneously separating blocks; (b) providing a substrate; (c) coating, on the substrate, a novel first formulation for depositing a first coating and thermally curing the first coating; (d) disposing the block copolymer on at least a portion of the cured first coating; wherein the first novel formulation comprises (i) a first polymer comprising at least one pendant vinyl ether monomer repeat unit having the structure (I); wherein R is chosen from H, $C_1$-$C_4$ alkyl, or halogen, and W is a divalent group chosen from $C_1$-$C_6$ alkylene, $C_6$-$C_{20}$ arylene, benzylene, or $C_2$-$C_{20}$ alkyleneoxyalkylene; (ii) optional thermal acid generator; and (iii) a solvent. In one embodiment the thermal acid generator is not a sulfonium or iodonium salt.

In another embodiment, the process for directing a multiplied pattern in a block copolymer film may further include: step (e) before disposing the block copolymer, forming a pattern in the cured first coating by a lithographic process. The process may further comprise a step (f) providing a second coating in the pattern of the cured first coating from a second formulation; and rinsing the second coating with a rinsing solution.

In still another embodiment, of the process for directing a multiplied pattern in a block copolymer film, the first coating may be a pinning layer and the second coating may be a neutral layer.

In still another embodiment, of the process for directing a multiplied pattern in a block copolymer film, the first coating may be a neutral layer and the second coating may be a pinning layer.

The second coating can be a brush neutral polymer or a brush pinning polymer. Examples of the second layer can be OH-brush neutral polymer such as PMMA-r-PS-OH with PS from 45-80 mol %; OH-brush pinning polymer, such as 100% PS-OH; and a second formulation comprising (i) a second polymer comprising at least one pendant vinyl ether monomer repeat unit having the structure (I), wherein R is chosen from H, $C_1$-$C_4$ alkyl, or halogen, and W is a divalent group chosen from $C_1$-$C_6$ alkylene, $C_6$-$C_{20}$ arylene, benzylene, or $C_2$-$C_{20}$ alkyleneoxyalkylene.

In one embodiment, the novel polymer of the novel first layer formulation can be where in structure (1), W is nonaromatic, such as $C_1$-$C_6$ alkylene, $C_2$-$C_{20}$ alkyleneoxyalkylene, furthermore such as exemplified by methylene, ethylene, branched or linear propylene, branched or linear butylene, branched or linear pentylene, branched or linear hexylene, $CH_2OCH_2$, $CH_2CH_2OCH2$, etc. The comonomer of structure (1) can be copolymerized with other comonomers such as (meth)acrylates to provide a pinning polymer to form a composition that can provide a novel pinning layer, which have an affinity towards one of the blocks of the block copolymer to be self assembled or copolymerized with comonomers like vinyl aromatics, such as styrenes, which have an affinity towards one of the blocks of the block copolymer to be self-assembled.

In another embodiment, the novel polymer of the novel first layer formulation can be where in structure (1), where W is a divalent group chosen from $C_1$-$C_6$ alkylene, $C_6$-$C_{20}$ arylene, benzylene, or $C_2$-$C_{20}$ alkyleneoxyalkylene; such as methylene, ethylene, branched or linear propylene, branched or linear butylene, branched or linear pentylene, branched or linear hexylene, $CH_2OCH_2$, $CH_2CH_2OCH2$, $CH_2$ phenylene, phenylene, alkylenePh, etc. The comonomer of structure (1) can be copolymerized with other comonomers such as (meth) acrylates to provide a pinning polymer to form a composition that can provide a novel pinning layer, which have an affinity towards one of the blocks of the block copolymer to be self assembled or copolymerized with comonomers like vinyl aromatics, such as styrenes, which have an affinity towards one of the blocks of the block copolymer to be self assembled.

The novel formulations of the above disclosures are suitably prepared by dissolving one or more components in a suitable solvent and agitating until a homogeneous mixture is obtained. Herein, it is understood that the one or more components may be dissolved separately and the separate solutions blended together to give the formulation. Alternatively, two or more of the individual components may be mixed together with a solvent and finally blended (if required). For example, the polymer and the thermal acid generator may be dissolved separately in their respective solvents, which may be the same or different, and the resulting solutions blended and agitated to obtain a homogeneous solution. As a further example, the polymer and the thermal acid generator can be added to a solvent or solvent mixture and agitated until a homogeneous solution is obtained.

Further, it may be advantageous to filter the resulting solutions to exclude fine particles. The required size rating of the filter may depend on the application and, other requirements such as cost. For example, it may be advantageous to filter the formulation through a filter rated at less than or equal to 100 nm (nanometers). As a further example, it may be advantageous to filter the formulation through a filter rated at less than or equal to 50 nm (nanometers). As a still further example, it may be advantageous to filter the formulation through a filter rated at less than or equal to 40 nm (nanometers). As a further example, it may be advantageous to filter the formulation through a filter rated at less than or equal to 10 nm (nanometers). As a further example, it may be advantageous to filter the formulation through a filter rated at less than or equal to 5 nm (nanometers). It also may be advantageous to subject the solution to a staged filtration, using a filter train having filters of decreasing size. Depending on the solvent and formulation components, and without limitation, filters may be constructed of symmetrical or asymmetrical ultra high density polyethylene, nylon, poly(tetrafluoroethylene), poly(vinylidine fluoride), hexafluoropropylene, perfluoropropylvinylether, perfluoromethylvinylether, or the like. Suitable filters may be obtained from Entegris, Inc. of Billerica, Mass.

Thermal acid generators are known to produce acids upon heating. Such acids may be Lewis acids or Brønsted acids. The latter acids may be characterized by their corresponding anion. Accordingly, thermal acid generators may produce acids having anions such as, without limitation, p-toluene sulfonate, dodecylbenzene sulfonate, perfluoro alkane sulfonates, perfluorinated and partially fluorinated alkoxy alkane sulfonates, benzene sulfonate and fluorinated benzene sulfonates, alkane sulfonates, camphor sulfonate, hexafluorophosphate, hexafluoroarsenate, hexafluoroantimonate, tetrafluoroborate, halogenides, phosphonates, and the like.

The anions of thermal acid generators may without limitation, be paired with groups that serve as counterions such as sulfonium or iodonium salts, ammonium salts, and ammonium salts of primary, secondary or tertiary amines. In addition, the anionic moieties may be covalently bonded as an ester or other linkage. For example thermal acid generators may be o-nitrobenzyl or p-nitrobenzyl esters, 5-norbornene-2,3-dicarboximidyl-N-esters such as 5-norbornene-2,3-dicarboximidyl-N-trifluoromethane sulfonate or other dicarboximidyl esters such as 1,3-dioxoisoindolin-2-yl-esters, or 1,3-dioxo-1H-benzo[de]isoquinolin-2(3H)-yl esters, oxime esters such as oxime sulfonates such as (Z)-2,2,2-trifluoro-1-phenylethanone O-trifluoromethylsulfonyl oxime, as described in U.S. Pat. No. 6,512,020 to Asakura et al. Further, alkane sulfonates may be used as thermal acid generators. In general, oxo-acid anions such as sulfonates may be esterified or used as salts, while non-oxo-acid anions such as tetrafluoroborate may be used as salts such as trimethylammonium tetrafluoroborate. Moreover, the thermal acid generator may comprise a substituted or unsubstituted halogenated alkyl compound.

Exemplary thermal acid generators may include, without limitation, the onium salts, halogen containing compounds, perfluorobenzene sulfonate esters, perfluoroalkane sulfonate esters. Without limitation, exemplary thermal acid generators for the above formulation include tri-$C_1$-$C_8$-alkylammonium p-toluenesulfonate, tri-$C_1$-$C_8$-alkylammonium dodecylbenzenesulfonate, tri-$C_1$-$C_8$-alkylammonium perfluorobutane-1-sulfonate, tri-$C_1$-$C_8$-alkylammonium trifluoromethanesulfonate, N-hydroxyphthalimide trifluoromethanesulfonate, bis(4-t-butyl phenyl)iodonium trifluoromethane sulfonate, bis(4-t-butyl phenyl)iodonium perfluoro-1-butanesulfonate, bis(4-t-butyl phenyl)iodonium perfluoro-1-octanesulfonate, bis(phenyl)iodonium hexafluoroantimonate, N-hydroxy-5-norbornene-2,3-dicarboximide perfluoro-1-butanesulfonate, 2-nitrobenzyl trifluoromethanesulfonate, 4-nitrobenzyl trifluoromethanesulfonate, 2-nitrobenzyl perfluorobutanesulfonate, 4-nitrobenzyl perfluorobutanesulfonate or a combination comprising at least one of the foregoing. Examples include, without limitation, ammonium salts of primary, secondary or tertiary amines. In certain applications, it may be desirable to exclude some types of thermal acid generators because of their high temperature characteristics or because they may leave undesirable byproducts behind that could lead to defects, particularly in a neutral layer or a pinning layer. Examples of these may include sulfonium or iodonium salts. Without intending to be bound by theory, it is believed that at least some of these byproducts derive from uncontrolled free radical reactions within the film. In contrast, other thermal acid generators of the "latent acid" variety create volatile byproducts that tend to evaporate from the film during baking. The thermal acid generator is capable of generating a strong acid upon heating. The thermal acid generator (TAG) used in the present invention may be any one or more that upon heating generates an acid which can react with the polymer and propagate crosslinking of the polymer present in the invention, particularly preferred is a strong acid such as a sulfonic acid. Preferably, the thermal acid generator is activated at above 90° C. and more preferably at above 120° C., and even more preferably at above 150° C. Examples of thermal acid generators are ammonium, alkylammonium, dialkylammonium, trialkylammonium, tetraalkylammonium salts of strong non nucleophilic acids. Also, covalent thermal acid generators are also envisaged as useful additives for instance 2-nitrobenzyl esters of alkyl or arylsulfonic acids and other esters of sulfonic acid which thermally decompose to give free sulfonic acids. Examples are quaternary ammonium perfluoroalkylsulfonate. Examples of labile esters: 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; quaternary ammonium tris (fluoroalkylsulfonyl)methide, and quaternaryalkyl ammonium bis(fluoroalkylsulfonyl)imide, alkyl ammonium salts of organic acids, such as triethylammonium salt of 10-camphorsulfonic acid. A variety of aromatic (anthracene, naphthalene or benzene derivatives) sulfonic acid amine salts can be employed as the TAG, including those disclosed in U.S. Pat. Nos. 3,474,054, 4,200,729, 4,251,665 and 5,187,019. Preferably the TAG will have a very low volatility at temperatures between 170-220° C. Examples of TAGs are those sold by King Industries under Nacure and CDX names.

Such TAG's are Nacure 5225, and CDX-2168E, which is a dodecylbenzene sulfonic acid amine salt supplied at 25-30% activity in propylene glycol methyl ether from King Industries, Norwalk, Conn. 06852, USA.

Suitable solvents for the layer formulation include, without limitation, glycol ether acetates, esters, α-hydroxy esters, α-alkoxy esters alcohols, ketones, amids, imides, ethers, ether esters, ether alcohols, aromatic solvents and the like. Specifically, solvents may include, without limitation, ethylene glycol monoethyl ether acetate, propylene glycol monomethyl ether acetate (PGMEA), ethyl-3-ethoxypropionate, methyl-3-methoxypropionate, butyl acetate, amyl acetate, cyclohexyl acetate, 3-methoxybutyl acetate, 3-ethoxyethyl propionate, 3-ethoxymethyl propionate, 3-methoxymethyl propionate, methyl acetoacetate, ethyl acetoacetate, methyl pyruvate, ethyl pyruvate, propylene glycol monomethyl ether propionate, propylene glycol monoethyl ether propionate, methyl ethyl ketone, methyl amyl ketone, cyclohexanone, cyclopentanone, diacetone alcohol, propylene glycol monomethyl ether, ethylene glycol monomethyl ether, ethylene glycol monoethyl ether, diethylene glycol monomethyl ether, diethylene glycol monoethyl ether, 3-methyl-3-methoxybutanol, N-methylpyrrolidone, dimethylsulfoxide, γ-butyrolactone, propylene glycol methyl ether acetate, propylene glycol ethyl ether acetate, propylene glycol propyl ether acetate, methyl lactate, ethyl lactate, propyl lactate, 2-butanone, 2-pentanone, 2-hexanone, 2-heptanone, cyclohexanone, cyclopentanone, or tetramethylene sulfone. The solvents may be used alone or as mixtures. Moreover, solvents for polymer synthesis may be selected from the foregoing.

The above formulation may further comprise suitable thermal curing agents that include, but are not limited to, imidazoles, primary, secondary, and tertiary amines, quaternary ammonium salts, anhydrides, polysulfides, polymercaptans, phenols, carboxylic acids, polyamides, quaternary phosphonium salts, and combinations thereof.

The polymers herein, whether pinning layers or neutral layers, may be pure polymers or blends. Moreover, the polymers may be blended with oligomers, monomers or other small molecules such as leveling agents, dissolution modifiers, flexiblizers, plasticizers and the like. In addition, the polymers may be, a telechelic polymers which, without limitation may be monofunctional or difunctional, and wherein the functional group(s) at the end of the polymer chains may be, without limitation, chosen from an alcohol group, an ester group, a carbonate group, a carboxylic acid group, a phosphonic acid group, a sulfonic acid group, an amine group, an amide or imide group, an epoxy group, a silyl group, an alkoxysilyl group, an alkylsilyl group, an aminosilane group, an isocyanate group, a thiocyanate group, or an isothiocyanate group. The monomer repeat units in the pinning materials and neutral materials may be the same or similar to those in one of the blocks in the selected block copolymer. For example, if the selected block copolymer is (b)-polystyrene-(b)-polymethylmethacrylate, the pinning material could comprise structure (I) and styrene or similar comonomers to styrene (such as 4-methylstyrene) or structure (I) and methyl methacrylate or similar comonomers to methyl methacrylate (such as acrylate). The molecular weight of the polymers disclosed herein may be, for example 800-500,000 Daltons. As a further example, the molecular weight of the polymer in the pinning material may be between 2,000-200,000 Daltons. As a still further example, the molecular weight of the polymer in the pinning material may be between 10,000-100,000 Daltons.

In addition to the pendant vinyl ether repeat unit of structure (I), polymers disclosed herein may comprise other monomer repeat units. These include, without limitation, $C_1$-$C_{10}$ alkyl (meth)acrylate, styrene, vinyl pyridine, butadiene, isoprene, ethylene, propylene, α-methyl styrene, itaconic anhydride, maleic anhydride, maleic acid, itaconic acid, hydroxyethyl methacrylate, 4-hydroxystyrene, isobornyl methacrylate, (meth)acrylamide, (meth)acrylonitrile, dimethyl siloxane, ethylene oxide, ethylene, 2-hydroxyethyl (meth)acrylate, or isobutylene.

Further, in addition to the pendant vinyl ether repeat unit of structure (I), polymers disclosed herein may comprise monomer repeat unit combinations such as methyl (meth)acrylate and styrene, butadiene and butyl (meth)acrylate, butadiene and dimethyl siloxane, butadiene and methyl(meth) acrylate, butadiene and vinyl pyridine, isoprene and methyl(meth) acrylate, isoprene and vinyl pyridine, butyl (meth)acrylate and methyl(meth)acrylate, butyl (meth)acrylate and vinyl pyridine, hexyl(meth)acrylate and vinyl pyridine, isobutylene and butyl (meth)acrylate, isobutylene and dimethylsiloxane, isobutylene and methyl (meth)acrylate, isobutylene and vinyl pyridine, isoprene and ethylene oxide, butyl (meth) acrylate and vinyl pyridine, ethylene and methyl (meth)acrylate, methyl (meth)acrylate and butyl (meth)acrylate, styrene and butadiene, styrene and butyl (meth)acrylate, styrene and dimethylsiloxane, styrene and isoprene, styrene and vinylpyridine, ethylene and vinyl pyridine, vinyl pyridine and methyl (meth)acrylate, ethylene oxide and isoprene, ethylene oxide and butadiene, ethylene oxide and styrene, ethylene oxide and methyl (meth)acrylate, 2-hydroxyethyl (meth)acrylate and butadiene, 2-hydroxyethyl (meth)acrylate and butyl (meth) acrylate, 2-hydroxyethyl (meth)acrylate and dimethyl siloxane, 2-hydroxyethyl (meth)acrylate and ethylene, 2-hydroxyethyl (meth)acrylate and hexyl(meth)acrylate, 2-hydroxyethyl (meth)acrylate and isobutylene, 2-hydroxyethyl (meth)acrylate and isoprene, 2-hydroxyethyl (meth) acrylate and styrene, 2-hydroxyethyl (meth)acrylate and vinyl pyridine, (meth)acrylonitrile and butadiene, (meth) acrylonitrile and butyl (meth)acrylate, (meth)acrylonitrile and dimethyl siloxane, (meth)acrylonitrile and ethylene oxide, (meth)acrylonitrile and ethylene, (meth)acrylonitrile and hexyl(meth)acrylate, (meth)acrylonitrile and 2-hydroxyethyl (meth)acrylate(meth), acrylonitrile and isobutylene, (meth)acrylonitrile and isoprene, (meth)acrylonitrile and methyl (meth)acrylate, (meth)acrylonitrile and styrene, or (meth)acrylonitrile and vinyl pyridine.

Polymerization may be initiated by free radical methods (where appropriate) and as known in the art. Initiators may include, without limitation, halogen dimers, azo compounds, such as azobisisobutyronitrile (AIBN), and 1,1'-azobis(cyclohexanecarbonitrile) (ABCN), and organic peroxides such as di-tert-butyl peroxide, benzoyl peroxide, methyl ethyl ketone peroxide, t-butyl peroctoate, and acetone peroxide. Numerous other initiators are available from Akzo Nobel Polymer Chemicals LLC, of Chicago, Ill.

Further, and without limitation, polymerization may also be initiated by anionic polymerization methods (where appropriate), using initiators such as lithium alkyl compounds, lithium or sodium biphenyl, lithium or sodium anthracene, sodium amide, potassium amide, alkali metal acrylonitrile adducts and the like. In addition, polymerization can occur using a combination of anionic and free radical polymerization, as disclosed in Japanese Patent Publication No. 58-225103 to Yokota.

Further, and without limitation, polymerization may also be initiated by cationic polymerization methods (where appropriate), using initiators such as without limitation, aluminum chloride, boron trifluoride, antimony pentachloride, titanium tetrachloride, zinc chloride, and alkyl aluminum dichloride. In addition, combinations such as aluminum chloride and tert-butyl chloride may be used to generate the tert-butyl carbocation.

Block copolymers useful for forming self-directed assembly may be made by anionic polymerization or other polymerization methods known in the art. Exemplary block copolymer assembly components that are contemplated for use in the present method also include a combination comprising at least one block copolymer. The block copolymer can be di-block copolymer as well as multi-block copolymer. Exemplary di-block copolymers include, without limitation, poly(styrene-b-vinyl pyridine), poly(styrene-b-butadiene), poly(styrene-b-isoprene), poly(styrene-b-methylmethacrylate), poly(styrene-b-alkenyl aromatics), poly(isoprene-b-ethylene oxide), poly(styrene-b-(ethylene-propylene)), poly(ethylene oxide-b-caprolactone), poly(butadiene-b-ethylene oxide), poly(styrene-b-t-butyl(meth)acrylate), poly(methyl methacrylate-b-t-butylmethacrylate), poly(ethylene oxide-b-propylene oxide), poly(styrene-b-tetrahydrofuran), poly((styrene-alt-maleic anhydride)-b-styrene), poly(styrene-b-dimethylsiloxane), and poly(styrene-b-dimethylgermanium oxide). Exemplary tri-block copolymers include poly(styrene-b-methyl methacrylate-b-styrene), poly(methyl methacrylate-b-styrene-b-methyl methacrylate), poly((styrene-alt-maleic anhydride)-b-styrene-b-methyl methacrylate), poly(styrene-b-dimethylsiloxane-b-styrene), and poly(ethylene oxide-b-isoprene-b-styrene). An exemplary multi-block copolymer is poly(styrene-b-methyl methacrylate) n, where n is greater than 1. It will be understood that the foregoing exemplary block copolymers are only intended to be illustrative and should not be considered as limited thereto.

The block copolymer can have an overall molecular weight and polydispersity amenable to the film forming steps disclosed herein, such that formation of spontaneously separating blocks in the block copolymer assembly can proceed thermally or thermally under conditions that may assist phase separation such as a solvent vapor atmosphere. In an embodiment, the block copolymer may have a number averaged molecular weight (Mn) of 1,000 to 200,000 g/mol. Molecular weight, both Mw and Mn, can be determined by, for example, gel permeation chromatography using a universal calibration method, calibrated to polystyrene standards. In a further embodiment each block in the block copolymer may separately have a molecular weight (Mn) of 250 to 175,000 g/mol. In a further embodiment, each block in the block copolymer may separately have a polydispersity (Mw/Mn) between 1.0 and 2.0. In a still further embodiment, each block in the block copolymer may separately have a polydispersity (Mw/Mn) between 1.0 and 1.5. In a still further embodiment, each block in the block copolymer may separately have a polydispersity (Mw/Mn) between 1.0 and 1.5. In a still further embodiment, each block in the block copolymer may separately have a polydispersity (Mw/Mn) between 1.0 and 1.1.

Lithographic processes used to image polymer layers may include patterning using methods and radiation types known in the art. These include photon beams having wavelengths in the x-ray, soft-x-ray, extreme ultraviolet, vacuum ultraviolet or ultraviolet ranges, electron beams, or ion beams. Photoresists known in the art may suitably be used in conjunction with the chosen radiation to form a pattern on cured polymer films. Such patterns may be etched into the cured polymer films using a variety of etching techniques such as plasma etching, reactive ion etching, ion milling, or other methods known in the art. The manner of producing a lithographically defined image is not critical and other techniques may be used without departing from the scope of the claims appended hereto.

The base on which the processes described herein may be practiced includes any substrate normally encountered in a semiconductor fabrication process. Such substrates include, without limitation, semiconductor substrates such as silicon or silicon-germanium, metal substrates such as aluminum or copper, compound substrates such as silicon dioxide, silicon nitride, silicon oxynitride, tantalum silicide, titanium silicide, titanium nitride, tantalum nitride, or polymers such as anti-reflective coatings.

Figure 2:
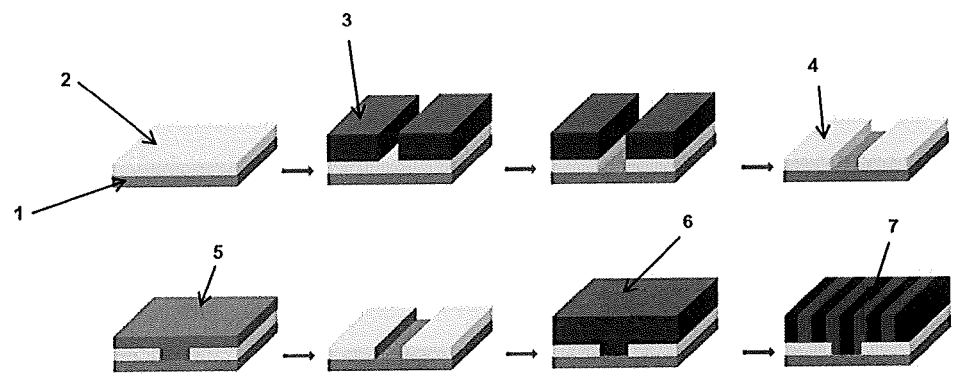
FIG. 2 relates to another process for direct self assembly of a block copolymer.

An example of processes which utilizes the present novel composition is shown in FIGS. 1 and 2.

FIG. 1 discloses a process where the novel composition is coated on a substrate (1) and then cured to form a pinning layer (2); the pinning layer is then patterned using a lithographic process with photoresist (3) to form a patterned pinning layer (4); the patterned pinning layer is further coated with a second coating of a neutral layer (5) and rinsed with a rinsing solution thereby depositing the second coating only in the openings of the patterned pinning layer; the block copolymer (6) is then coated over the pinning patterned layer with the second coating and heated to self-assemble the block copolymer. The self-assembled block copolymer is then dry or wet etched to form a pattern (7). FIG. 2 discloses another process where the novel composition is coated on a substrate (1) and then cured to form a neutral layer (2), the neutral layer is then patterned using a lithographic process with photoresist (3) to form a patterned neutral layer (4); optionally, the patterned neutral layer is further coated with a second coating of a pinning layer (5) and rinsed with a rinsing solution thereby depositing the second coating only in the openings of the neutral layer; the block copolymer (6) is then coated over the neutral patterned layer with the second pinning coating and heated to self-assemble the block copolymer (7). The self-assembled block copolymer is then dry or wet etched to form a pattern.

The pendant vinyl ether monomer repeat units disclosed herein may be synthesized according to or by analogy with Synthesis Example 1, infra.

Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

The molecular weight of the polymers was measured on a Gel Permeation Chromatograph using a Water 2695 Alliance Separation Module, or equivalent equipped with a Waters Dual Wavelength UV Detector, Model 2487, or equivalent and a Waters Differential Refractometer, Model 2414, Dectector equivalent, a Shodex Columns set as follows: one Shodex GPC KF-801 ($1.5\times10^3$) column, Two Shodex GPC KF-802 ($5\times10^3$) columns and one Shodex GPC KF-804 ($4\times10^5$) column. The mobile phase was UV stabilized THF HPLC grade and the molecular weight standard was as set of polystyrene standards supplied by American Standards Corporation and Millipore Corporation or equivalent.

Synthesis Example 1

Synthesis of 2-vinyloxyethyl methacrylate (VEMA)

40 g of sodium methacrylate was suspended in 300 g of dimethylsulfoxide (DMSO) in a 2 L flask equipped with a mechanical stirrer, cold water condenser and heating mantle. 0.35 g of 4-methoxyphenol was added. The mixture was heated to 80° C. with stirring under a nitrogen blanket. During heating, 36 g of 2-chloroethyl vinyl ether was added over 30 minutes. The reaction was then maintained at 80° C. for 20 hr. After the reaction solution was cooled to room temperature, 0.45 g of sodium hydroxide dissolved in 300 ml of water was added and the mixture was stirred for 20 minutes. About 500 g of chloroform was then added and the resulting mixture was stirred for 30 minutes. The mixture was then transferred into a separatory funnel. The bottom layer was separated and discarded. The chloroform layer was washed thoroughly with deionized (DI) water and dried with sodium sulfate. The filtrate was then subjected to rotary evaporation at room temperature to remove most of the volatile materials. The lightly colored liquid was consistent with 2-vinyloxyethyl methacrylate (VEMA) by proton NMR: (in CDCl3): 1.98 ppm (3H CH3), 3.8 ppm (2H C(O)CH2CH2-O), 4.3 ppm (2 H C(O) CH2CH2-O), 4.0 ppm and 4.2 ppm (2H OCHCH2), 5.5 ppm and 6.2 ppm (2H CH2=C(CH3)), 6.5 ppm (1H OCHCH2).

Synthesis Example 2

Synthesis of Copolymer for Pinning Application in DSA

VEMA, 3.76 g, prepared as described in Synthesis Example 1, 13.6 g of methyl methacrylate (MMA), 0.183 g of 2,2'-azobis(2-methylpropionitrile) (AIBN) and 0.3 g of n-dodecanthiol were dissolved in 38 g of dimethylformamide (DMF) in a 200 ml flask equipped with a magnetic stir bar and cold water condenser. After nitrogen purge for 30 minutes the flask was put into a 60° C. oil bath. Polymerization was carried out at this temperature for 1 hour and the solution was allowed to cool to room temperature. The polymer solution was precipitated by pouring the reaction mixture slowly into about 400 ml of methanol with stirring, and the precipitate was isolated by filtering. The resulting polymer was purified by dissolving in 20 g of tetrahydrofuran(THF) and precipitating in 200 ml of methanol. The polymer was then dried in a 50° C. vacuum oven until a constant weight of 4 g was obtained. Gel permeation chromatography indicated an $M_w$ of 49,870 and a $M_n$ of 23,571 g/mol. VEMA incorporation in the polymer was estimated by proton NMR to be about 15 mol %.

Synthesis Example 3

Synthesis of Copolymer for Neutral Layer in DSA

VEMA, 3.12 g, prepared as Synthesis Example 1, 4.0 g of methyl methacrylate (MMA), 14.6 g of styrene 0.22 g of 2,2'-azobis(2-methylpropionitrile) (AIBN) and 0.46 g of n-dodecanthiol were dissolved in 41 g of tetrahydrofuran (THF) in a 200 ml flask equipped with a magnetic stir bar and cold water condenser. After nitrogen purge for 30 min the flask was put into a 70° C. oil bath. Polymerization was carried out at this temperature for 6 hours and the solution was allowed to cool to room temperature. The polymer solution was slowly poured into about 400 ml of methanol with stirring to precipitate the polymer and the polymer was isolated by filtering. The polymer was purified by dissolving in 20 g of tetrahydrofuran and precipitating in 200 ml of methanol. The polymer was then dried in a 50° C. vacuum oven until a constant weight of 5.8 g was obtained. Gel permeation chromatography indicated an $M_w$ of 11,929 and a $M_n$ of 6,909 g/mol.

Test Example 1

Curing Test

The polymer obtained from Synthesis Example 2 was dissolved in PGMEA to prepare a 1.0 wt % solution. P-toluenesulfonic acid/triethylamine (a thermal acid generator, TAG) was added to make the TAG 1 wt % relative to the polymer. The solution was filtered with a 0.2 μm PTFE microfilter. The filtered solution was spin cast on an 8 inch silicon wafer at 1500 rpm for 30 seconds and the coated wafer was baked at 250° C. under nitrogen for 2 min. Film thickness was measured to be 206.4 Å by NanoSpec. The wafer was puddle-rinsed with PGMEA for 30 seconds and baked at 110° C. for 1 min. The film thickness was 207.3 Å, indicating that the polymer coating was sufficiently crosslinked to withstand substantial solvent attack.

Test Example 2

Curing Test

The polymer obtained from Synthesis Example 3 was dissolved in PGMEA to prepare a 0.9 wt % solution. P-toluenesulfonic acid/triethylamine (a thermal acid generator, TAG) was added to make the TAG 1 wt % relative to the polymer. The solution was filtered with a 0.2 μm PTFE microfilter. The solution was spin cast on an 8 inch silicon wafer at 1500 rpm for 30 seconds and the coated wafer was baked at 200° C. in air for 2 min. Film thickness was measured to be 216.3 Å by NanoSpec. The wafer was puddle-rinsed with PGMEA for 30 seconds and baked at 110° C. for 1 min, the film thickness was 215.8 Å indicating that the polymer coating was sufficiently crosslinked to withstand substantial solvent attack.

Test Example 3

Test of the Neutral Polymer

The polymer obtained from Synthesis Example 3 was dissolved in PGMEA to prepare a 0.9 wt % solution. p-toluenesulfonic acid/triethylamine (a thermal acid generator, TAG) was added to make the TAG 1 wt % relative to the polymer. The solution was filtered with a 0.2 μm PTFE microfilter. The solution was spin cast on an 8 inch silicon wafer at 1500 rpm for 30 seconds and the wafer was baked at 200° C. in air for 2 min. Film thickness was measured to be 216.3 Å by NanoSpec. A diblock copolymer solution of Polystyrene-b-poly (methyl methacrylate) in PGMEA ($M_n$ for PS: 22,000 g/mol and $M_n$ for PMMA: 22,000 g/mol. PDI: 1.02) was spin cast over the above wafer at 1500 rpm for 30 seconds and the wafer annealed in air at 250° C. for 2 min. A defect-free finger print (successful self assembly) of diblock polymer were observed under NanoSEM, indicating the neutral layer was neutral to this diblock polymer.

Test Example 4

An inorganic antireflective coating (ARC) film of $Si_3N_4$, of 15 nm thickness was deposited via chemical vapor deposition (CVD) on 300 mm Si wafers. The polymer, pinning layer, obtained from Synthesis Example 2 was spun on the substrate and cured by baking at 250° C. under nitrogen for 2 min. JSR AIM 8490 PTD photoresist from JSR Corporation, Tokyo, Japan, was coated at 1500 rpm and baked at 120° C. for 60 s. After exposure in a 193 nm immersion lithography tool (ASML NXT-1950i scanner, XY polarized NA 1.35, $\sigma_o$=0.87, $\sigma_i$=0.72, dipole 40), post exposure bake was performed at 100° C. for 60 sec and developed. The samples were then submitted to an $O_2$ and Ar plasma (pressure: 50 mtorr, 15 sccm (O2), 100 sccm (Ar), power: 50 W) etch step to trim the resist pattern and remove the cured polymer layer, pinning layer, exposed to the plasma. The remaining resist was then removed using a wet resist strip using solvent mixture, Gamma Valerolactone (GVL) and nButyl acrylate=70:30 and PGMEA solvent at room temperature. A second formulation, hydroxyl-endcapped poly(styrene-r-MMA), was spun coated and annealed for 2 min at 250° C. in a nitrogen atmosphere. Non-reacted material was rinsed with propylene glycol methyl ether acetate and baked at 100° C. for 60 sec. The PS-b-PMMA block copolymer solution such as AZEM-BLY™ PME-190, available from AZ Electronic Materials, 70 Meister Ave, Somerville, N.J., was coated on the patterned wafer and annealed at 250° C. for 5 min. An inspection of the top film indicated successful self assembly of the block copolymer features.

Although the present disclosure has been shown and described with reference to particular examples, various changes and modifications which are obvious to persons skilled in the art to which the invention pertains are deemed to lie within the spirit, scope and contemplation of the subject matter set forth in the appended claims.

What is claimed is:

1. A formulation for depositing an underlayer for promoting the formation of self assembled structures, comprising:
   a) a polymer comprising at least one pendant vinyl ether monomer repeat unit having the structure

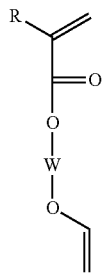

wherein R is selected from H, $C_1$-$C_4$ alkyl, or halogen, and W is a divalent group selected from $C_1$-$C_6$ alkylene, $C_6$-$C_{20}$ arylene, benzylene, or $C_2$-$C_{20}$ alkyleneoxyalkylene; b) optional thermal acid generator; and c) a solvent.

2. The formulation according to claim 1, further comprising a thermal acid generator.

3. The formulation according to claim 2, where the thermal acid generator is not sulfonium or iodonium salt.

4. The formulation of claim 2, wherein the one or more thermal acid generator is selected from a group consisting of substituted or unsubstituted halogenated alkyl compound, a substituted or unsubstituted alkane sulfonate, a substituted or unsubstituted 2-nitrobenzyl sulfonic acid ester, an acid salt of a primary amine, an acid salt of a secondary amine, an acid salt of a tertiary amine, a dicarboximidyl sulfonic acid ester, and an oxime sulfonate ester.

5. The formulation of claim 2, wherein the one or more thermal acid generator is selected from a group consisting of tri-$C_1$-$C_8$-alkylammonium p-toluenesulfonate, tri-$C_1$-$C_8$-alkylammonium dodecylbenzenesulfonate, tri-$C_1$-$C_8$-alkylammonium perfluorobutane-1-sulfonate, tri-$C_1$-$C_8$-alkylammonium trifluoromethane-sulfonate, 1,2,3-tris(perfluoro $C_1$-$C_8$ alkane sulfonyloxy) benzene, 1,2,3-tris($C_1$-$C_8$ alkane sulfonyloxy) benzene, 1,2,3-tris(p-toluene sulfonyloxy) benzene, 4-nitrobenzyl 9,10-dimethoxyanthracene-2-sulfonate, N-hydroxyphthalimide trifluoromethane-sulfonate, 2-nitrobenzyl trifluoromethanesulfonate, 4-nitrobenzyl trifluoromethanesulfonate, 2-nitrobenzyl perfluorobutane-sulfonate, 4-nitrobenzyl perfluorobutanesulfonate and a combination comprising at least one of the foregoing.

6. The formulation of claim 1, wherein the polymer further comprises one or more monomer repeat units selected from a group consisting of $C_1$-$C_{10}$ alkyl (meth)acrylate, styrene, vinyl pyridine, butadiene, isoprene, ethylene, propylene, α-methyl styrene, itaconic anhydride, maleic anhydride, maleic acid, itaconic acid, hydroxyethyl methacrylate, 4-hydroxystyrene, isobornyl methacrylate, (meth)acrylamide, (meth)acrylonitrile, dimethyl siloxane, ethylene oxide, ethylene, 2-hydroxyethyl (meth)acrylate, and isobutylene.

7. The formulation of claim 1, wherein the polymer is a random copolymer.

8. The formulation of claim 1, wherein the polymer further comprises one or two monomer repeat units selected from styrene or methyl methacrylate.

9. A process of producing the formulation of claim 1, for depositing an underlayer for promoting the formation of self assembled structures, comprising:
   a. agitating a mixture, comprising
      the formulation of claim 1, and whereby a homogenous solution is produced; and
   b. filtering the resulting homogeneous solution with a filter.

10. The process of claim 9, wherein the one or more thermal acid generator is selected from a group consisting of a substituted or unsubstituted halogenated alkyl compound, a substituted or unsubstituted alkane sulfonate, a substituted or unsubstituted 2-nitrobenzyl sulfonic acid ester, an acid salt of a primary amine, an acid salt of a secondary amine, an acid salt of a tertiary amine, a dicarboximidyl sulfonic acid ester, and an oxime sulfonate ester.

11. The process of claim 9, wherein the polymer further comprises one or more monomer repeat units selected from a group consisting of $C_1$-$C_{10}$ alkyl (meth)acrylate, styrene, vinyl pyridine, butadiene, isoprene, ethylene, propylene, α-methyl styrene, itaconic anhydride, maleic anhydride, maleic acid, itaconic acid, hydroxyethyl methacrylate, 4-hydroxystyrene, isobornyl methacrylate, (meth)acrylamide, (meth)acrylonitrile, dimethyl siloxane, ethylene oxide, ethylene, 2-hydroxyethyl (meth)acrylate, and isobutylene.

12. The process of claim 9, wherein the polymer is a random copolymer.

13. The process of claim 9, wherein the polymer further comprises one or two monomer repeat units selected from styrene or methyl methacrylate.

14. A process for directing a multiplied pattern in a block copolymer film, said process comprising:
   a. providing a block copolymer having two or more spontaneously separating blocks;
   b. providing a substrate;
   c. coating, on the substrate the formulation of claim 1, for depositing a first coating and thermally curing the first coating; and,
   d. disposing the block copolymer on at least a portion of the cured first coating.

15. The process of claim 14, further comprising:
e. before disposing the block copolymer, forming a pattern in the cured first coating by a lithographic process; and,
f. optionally providing a second coating in the pattern from a second formulation comprising a second polymer and thereafter rinsing with a rinse solution.

16. The process of claim 15, wherein the second formulation comprises (i) the second polymer which is different from the first polymer and comprising at least one pendant vinyl ether monomer repeat unit having the structure

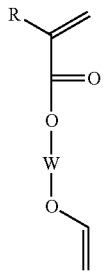

wherein R is selected from H, $C_1$-$C_4$ alkyl, or halogen, and W is a divalent group selected from $C_1$-$C_6$ alkylene, $C_6$-$C_{20}$ arylene, benzylene, or $C_2$-$C_{20}$ alkyleneoxyalkylene; (ii) optional thermal acid generator, and (ii) a solvent.

17. The process of claim 15, wherein, the first coating is a pinning layer and the second coating is a neutral layer.

18. The process of claim 14, wherein the first polymer further comprises at least one monomer repeat unit selected from the group consisting of $C_1$-$C_{10}$ alkyl (meth)acrylate, styrene, vinyl pyridine, butadiene, isoprene, ethylene, propylene, α-methyl styrene, itaconic anhydride, maleic anhydride, maleic acid, itaconic acid, hydroxyethyl methacrylate, 4-hydroxystyrene, isobornyl methacrylate, (meth)acrylamide, (meth)acrylonitrile, dimethyl siloxane, ethylene oxide, ethylene, 2-hydroxyethyl (meth)acrylate, or isobutylene.

19. The process of claim 16, wherein the second polymer further comprises at least one combination of monomer repeat units, said combination selected from the group consisting of methyl (meth)acrylate and styrene, butadiene and butyl (meth)acrylate, butadiene and dimethyl siloxane, butadiene and methyl(meth) acrylate, butadiene and vinyl pyridine, isoprene and methyl(meth) acrylate, isoprene and vinyl pyridine, butyl (meth)acrylate and methyl(meth)acrylate, butyl (meth)acrylate and vinyl pyridine, hexyl(meth)acrylate and vinyl pyridine, isobutylene and butyl (meth)acrylate, isobutylene and dimethylsiloxane, isobutylene and methyl (meth)acrylate, isobutylene and vinyl pyridine, isoprene and ethylene oxide, butyl (meth)acrylate and vinyl pyridine, ethylene and methyl (meth)acrylate, methyl (meth)acrylate and butyl (meth)acrylate, styrene and butadiene, styrene and butyl (meth)acrylate, styrene and dimethylsiloxane, styrene and isoprene, styrene and vinylpyridine, ethylene and vinyl pyridine, vinyl pyridine and methyl (meth)acrylate, ethylene oxide and isoprene, ethylene oxide and butadiene, ethylene oxide and styrene, ethylene oxide and methyl (meth)acrylate, 2-hydroxyethyl (meth)acrylate and butadiene, 2-hydroxyethyl (meth)acrylate and butyl (meth)acrylate, 2-hydroxyethyl (meth)acrylate and dimethyl siloxane, 2-hydroxyethyl (meth)acrylate and ethylene, 2-hydroxyethyl (meth)acrylate and hexyl(meth)acrylate, 2-hydroxyethyl (meth)acrylate and isobutylene, 2-hydroxyethyl (meth)acrylate and isoprene, 2-hydroxyethyl (meth)acrylate and styrene, 2-hydroxyethyl (meth)acrylate and vinyl pyridine, (meth)acrylonitrile and butadiene, (meth)acrylonitrile and butyl (meth)acrylate, (meth)acrylonitrile and dimethyl siloxane, (meth)acrylonitrile and ethylene oxide, (meth)acrylonitrile and ethylene, (meth)acrylonitrile and hexyl(meth)acrylate, (meth)acrylonitrile and 2-hydroxyethyl (meth)acrylate(meth), acrylonitrile and isobutylene, (meth)acrylonitrile and isoprene, (meth)acrylonitrile and methyl (meth)acrylate, (meth)acrylonitrile and styrene, or (meth)acrylonitrile and vinyl pyridine.

20. The process of claim 15, wherein, the first coating is a neutral layer and the second coating is a pinning layer.

* * * * *